(12) United States Patent  
Sims et al.

(10) Patent No.: US 9,766,293 B2  
(45) Date of Patent: Sep. 19, 2017

(54) VEHICLE BATTERY MONITORING SYSTEM

(75) Inventors: Michael J. Sims, Zeeland, MI (US); Pascal Muis, Pontoise (FR); Frederic Eloy, Mezieres sur Seine (FR); Jean-Claude Lemoult, Cherré (FR); Grégoire Lagabe, Paris (FR)

(73) Assignee: Johnson Controls Technology Company, Holland, MI (US)

( * ) Notice: Subject to any disclaimer, the term of this patent is extended or adjusted under 35 U.S.C. 154(b) by 562 days.

(21) Appl. No.: 13/820,720

(22) PCT Filed: Sep. 9, 2011

(86) PCT No.: PCT/US2011/051047  
§ 371 (c)(1),  
(2), (4) Date: Apr. 30, 2015

(87) PCT Pub. No.: WO2012/034045  
PCT Pub. Date: Mar. 15, 2012

(65) Prior Publication Data  
US 2015/0301113 A1     Oct. 22, 2015

Related U.S. Application Data

(60) Provisional application No. 61/381,592, filed on Sep. 10, 2010.

(51) Int. Cl.  
G01N 27/416    (2006.01)  
G01R 31/36     (2006.01)  
(Continued)

(52) U.S. Cl.  
CPC ......... G01R 31/3606 (2013.01); G01K 13/00 (2013.01); G01R 31/3686 (2013.01);  
(Continued)

(58) Field of Classification Search  
CPC ........... G01R 31/3686; G01R 31/3689; H01M 10/4285  
(Continued)

(56) References Cited

U.S. PATENT DOCUMENTS 6,915,220 B2    7/2005 Cardinal et al.  
7,598,880 B2   10/2009 Powell et al.  
(Continued)

FOREIGN PATENT DOCUMENTS

CN     101192691    6/2008  
CN     201413387    2/2010  
DE     102007063280  7/2009

OTHER PUBLICATIONS

Office Action and Search Report for Chinese Patent Application No. 201180054181.0 issued Oct. 15, 2014.  
(Continued)

*Primary Examiner* — Edward Tso  
*Assistant Examiner* — Aaron Piggush  
(74) *Attorney, Agent, or Firm* — Fletcher Yoder P.C.

(57) ABSTRACT

A battery monitoring system includes a self-contained measurement device configured to mount to a battery cell. The self-contained measurement device includes a sensor configured to monitor an operational parameter of the battery cell, and a communication module configured to output a signal indicative of the operational parameter.

18 Claims, 4 Drawing Sheets

(51) Int. Cl.
*H04Q 9/00* (2006.01)
*G01K 13/00* (2006.01)
*H01M 10/42* (2006.01)
*H04B 3/54* (2006.01)

(52) U.S. Cl.
CPC ........ *H01M 10/4285* (2013.01); *H04B 3/548* (2013.01); *H04Q 9/00* (2013.01); *G01R 31/3689* (2013.01); *H04B 2203/5445* (2013.01); *H04B 2203/5458* (2013.01); *H04Q 2209/10* (2013.01); *H04Q 2209/40* (2013.01); *H04Q 2209/75* (2013.01); *H04Q 2209/883* (2013.01)

(58) Field of Classification Search
USPC .................................. 320/108, 134; 324/426
See application file for complete search history.

(56) References Cited

U.S. PATENT DOCUMENTS

| | | | |
|---|---|---|---|
| 7,671,559 B2 | 3/2010 | Ludtke | |
| 2009/0033277 A1* | 2/2009 | Ludtke | .................. H02J 7/0004 320/106 |
| 2009/0096413 A1* | 4/2009 | Partovi | .................. H01F 5/003 320/108 |

OTHER PUBLICATIONS

International Search Report and Written Opinion for PCT No. PCT/US2011/051047, mailed Dec. 23, 2011, 8 pgs.

\* cited by examiner

VEHICLE BATTERY MONITORING SYSTEM

CROSS REFERENCE TO RELATED APPLICATION

This application claims priority from and the benefit of International Application Serial No. PCT/US2011/051047, entitled "VEHICLE BATTERY MONITORING SYSTEM", filed Sep. 9, 2011, and U.S. Provisional Application Ser. No. 61/381,592, entitled "VEHICLE BATTERY MONITORING SYSTEM", filed Sep. 10, 2010, which is hereby incorporated by reference in its entirety.

BACKGROUND

The invention relates generally to a vehicle battery monitoring system, and more specifically, to a self-contained measurement device configured to mount to a battery cell within a vehicle.

Hybrid and fully-electric vehicles typically include an array of battery cells configured to power at least one electric motor. Monitoring various parameters of each battery cell may provide data for efficiently operating the array. For example, the temperature of each battery cell, or group of cells, may be monitored to ensure that the cell temperature does not exceed a predetermined value for efficient operation. In addition, the voltage of each cell may be measured to provide an accurate determination of the state of charge, to facilitate energy balancing between cells, and/or to ensure that the voltage does not exceed a predetermined value.

Certain battery monitoring systems include a battery management unit configured to receive electrical power from the battery array, and to transfer the electrical power to an electrical distribution system. The battery management unit may also be configured to receive signals from cell measurement electronics which monitor various parameters of the battery cells within the array. For example, a printed circuit board (PCB) may be associated with each battery cell, or group of battery cells, within the array. In such configurations, the PCB is electrically connected to each terminal of the battery cell to measure output voltage. To account for variations in cell dimension and/or vehicle movement, spring connectors, wire harnesses or flex circuit assemblies may be employed to establish the electrical connection between each terminal of the battery cell and the PCB. For example, a spring connector, wire link or flex circuit may be welded or soldered to the PCB, and secured to the terminal by a fastener (e.g., screw, washer, etc.). Unfortunately, movement of the vehicle may cause such connections to wear over time, thereby degrading the electrical power signal to the PCB, and interfering with battery cell monitoring operations.

In such arrangements, each PCB is configured to transmit the measured battery cell parameters to the battery management unit. In certain configuration, electrical cables may extend between the PCBs and the battery management unit, forming a bus (e.g., CAN bus). Unfortunately, the electrical cables increase the weight and production costs of the battery monitoring system. In addition, the cables may wear over time, thereby degrading the signals from the PCBs to the battery management unit. As a result, the overall efficiency of the battery array may be reduced.

BRIEF DESCRIPTION OF THE INVENTION

The present invention relates to a battery monitoring system including a self-contained measurement device configured to mount to a battery cell within a vehicle. The self-contained measurement device includes a sensor configured to monitor an operational parameter of the battery cell, and a communication module configured to output a signal indicative of the operational parameter.

The present invention also relates to a battery monitoring system including a sensor configured to monitor an operational parameter of a battery cell within a vehicle. The battery monitoring system also includes a communication module configured to output a signal indicative of the operational parameter via modulation of a power signal output by the battery cell.

The present invention further relates to a battery monitoring system including a self-contained measurement device configured to mount to a battery cell. The self-contained measurement device includes a sensor configured to monitor an operational parameter of the battery cell, and a first communication module configured to output a signal indicative of the operational parameter via a wireless communication link.

DRAWINGS

DETAILED DESCRIPTION

Figure 1:
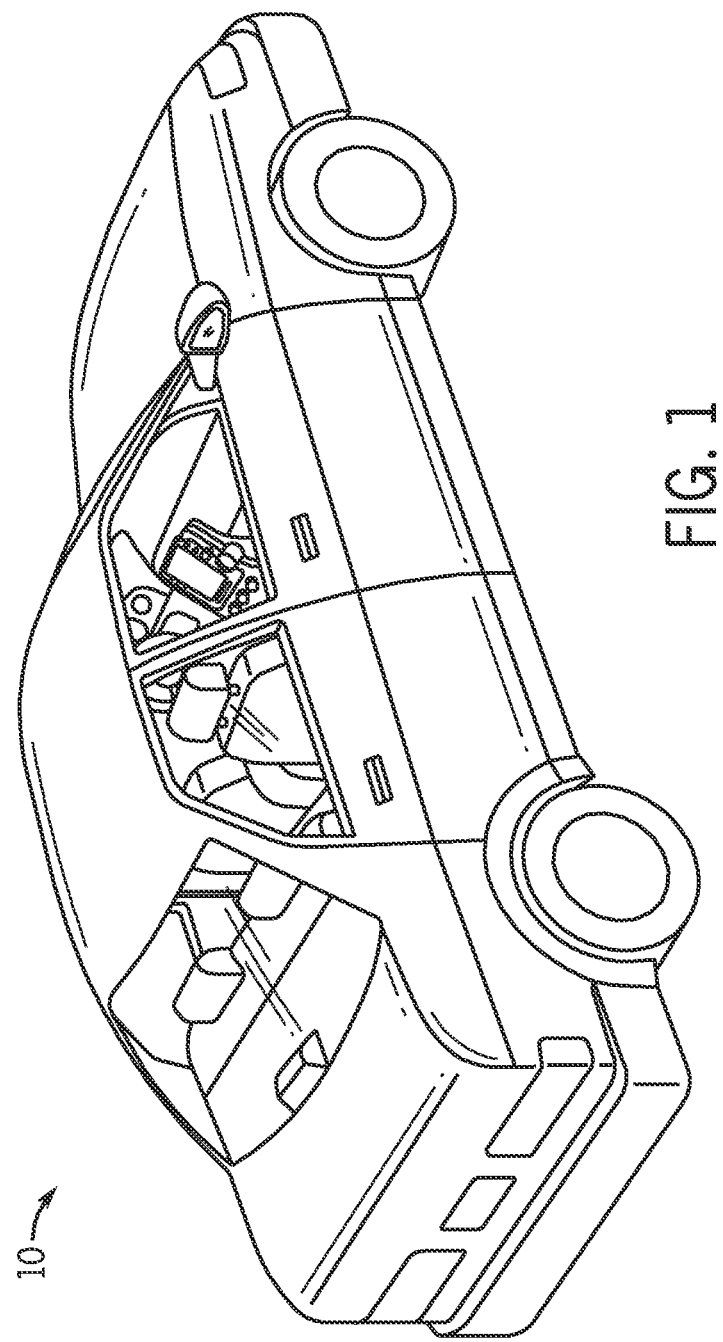
FIG. 1 is a perspective view of an exemplary vehicle that may include a self-contained measurement device configured to mount to a battery cell within the vehicle.

FIG. 1 is a perspective view of an exemplary vehicle 10 that may include a self-contained measurement device configured to mount to a battery cell within the vehicle 10. In certain embodiments, the vehicle 10 includes an array of battery cells configured to power at least one electric motor. For example, the vehicle 10 may include a hybrid propulsion system including a gas-powered engine and an electric motor. Alternatively, the vehicle 10 may include a gas-powered engine and an electric starter motor configured to initiate operation of the engine (e.g., via a start/stop system). Monitoring various parameters of each battery cell may provide data for efficiently operating the array. For example, the temperature of each battery cell, or group of cells, may be monitored to ensure that the cell temperature does not exceed a predetermined value for operation. In addition, the voltage of each cell may be measured to provide an accurate determination of the state of charge, to facilitate energy balancing between cells, and/or to ensure that the voltage does not exceed a predetermined value.

Certain embodiments described below include a self-contained measurement device configured to mount to a battery cell within the vehicle 10. The self-contained measurement device includes a sensor configured to monitor an operational parameter (e.g., voltage, temperature, etc.) of the battery cell, and a communication module configured to output a signal indicative of the operational parameter. As discussed in detail below, the measurement device may be mounted to an exterior surface or an interior surface of the battery cell. Because the self-contained measurement device is mounted to the battery cell, spring connectors, wire harnesses or flex circuit assemblies, employed in certain embodiments to couple a measurement device to terminals of the battery cell, may be obviated. Consequently, the possibility of signal degradation associated with worn connectors may be substantially reduced or eliminated. In addition, mounting the measurement device directly to the battery cell enables the cells to be mounted in a variety of orientations and locations with the vehicle 10.

In certain embodiments, the communication module is configured to output a signal indicative of the operational parameter via modulation of a power signal output by the battery cell. In alternative embodiments, the communication module is configured to output the signal indicative of the operational parameter via a wireless communication link. In such embodiments, data cables, employed in certain embodiments to communicatively couple each measurement device to a battery management unit, may be obviated. The reduction in wiring may substantially reduce the weight and manufacturing costs of the battery monitoring system. In addition, the reduced number of connections may enhance the reliability and efficiency of the vehicle propulsion system.

Figure 2:
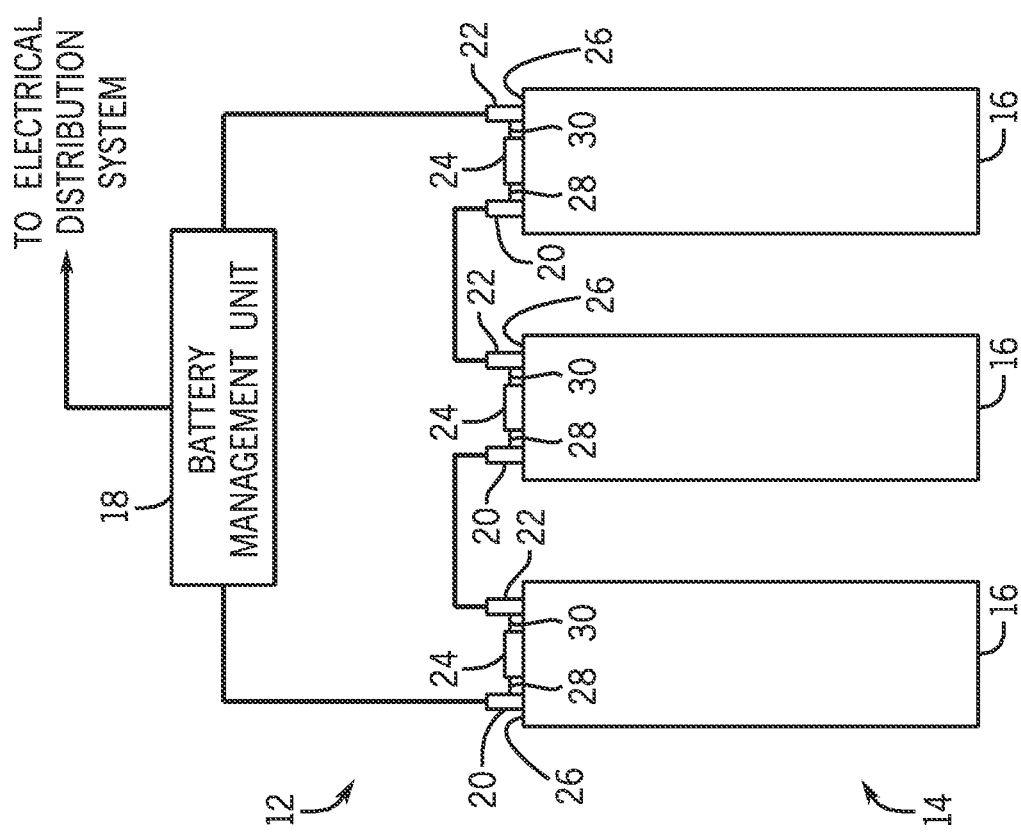
FIG. 2 is a block diagram of an embodiment of a battery monitoring system including a self-contained measurement device mounted to an exterior surface of a battery cell.

FIG. 2 is a block diagram of an embodiment of a battery monitoring system 12 including a self-contained measurement device mounted to an exterior surface of a battery cell. As illustrated, the system 12 includes an array 14 of battery cells 16 connected in series to a battery management unit 18. While three battery cells 16 are included within the illustrated array 14, it should be appreciated that more or fewer cells 16 may be employed in alternative array configurations. For example, in certain embodiments, multiple battery cells 16 may be grouped into modules, with multiple modules forming the array 14. In such embodiments, a first bus bar may be electrical coupled to a positive terminal 20 of each cell 16 within a module, and a second bus bar may be electrically coupled to a negative terminal 22 of each cell 16 within the module. The bus bars, in turn, may be electrically coupled to the battery management unit 18 and configured to transfer an electrical power signal from the battery cells 16 to the battery management unit 18. Multiple modules may be connected in series to form the array 14, and to provide a desired electrical power output to a vehicle propulsion system or other load. In alternative embodiments, individual battery cells 16 and/or modules may be connected in parallel, or any other suitable arrangement involving parallel and serial configurations.

In the illustrated embodiment, a self-contained measurement device 24 is mounted to an exterior surface 26 of each battery cell 16. In certain embodiments, the measurement device 24 is permanently affixed to the exterior surface 26. As discussed in detail below, each self-contained measurement device 24 includes a sensor configured to monitor an operational parameter of the battery cell 24, and a communication module configured to output a signal indicative of the operational parameter to the battery management unit 18. As illustrated, each self-contained measurement device 24 includes a first lead 28 coupled to the positive terminal 20 of a respective battery cell 16, and a second lead 30 coupled to the negative terminal 22 of the battery cell 16. In certain embodiments, the communication module is communicatively coupled to the first and second leads 28 and 30, and configured to output the signal indicative of the operational parameter via modulation of a power signal output by the battery cell 16. In further embodiments, the sensor (e.g., voltmeter) may be coupled to the first and second leads 28 and 30, and configured to measure a parameter of the power signal (e.g., voltage).

Because the self-contained measurement device 24 is directly mounted to the exterior surface 26 of the battery cell 16, the measurement device 24 may monitor the temperature of the battery cell 16. For example, in certain embodiments, the self-contained measurement device 24 includes a temperature sensor, such as a thermocouple. By placing the temperature sensor in direct contact with the exterior surface 26 of the cell 16, the temperature sensor may accurately measure the battery cell temperature. In further embodiments, the components of the self-contained measurement system 24, including the temperature sensor, may be coupled to the surface of an integrated circuit. In such embodiments, mounting the integrated circuit directly to the exterior surface 26 of the cell 16 enables the surface-mounted temperature sensor to measure the temperature of the cell 16.

Because the self-contained measurement device 24 is mounted to the battery cell 16, the spring connectors, wire harnesses or flex circuit assemblies which couple PCBs to the terminals 20 and 22 may be obviated. Consequently, the possibility of signal degradation associated with worn connectors may be substantially reduced or eliminated. In addition, mounting the measurement device 24 directly to the battery cell 16 enables the cells 16 to be mounted in a variety of orientations and locations with the vehicle 10. For example, a battery cell 16 may be disposed within a region of the vehicle 10 which does not include a suitable location for mounting the PCB. As a result, an increased number of battery cells 16 may be disposed within the vehicle 10, thereby providing the propulsion system with additional electrical energy.

Figure 3:
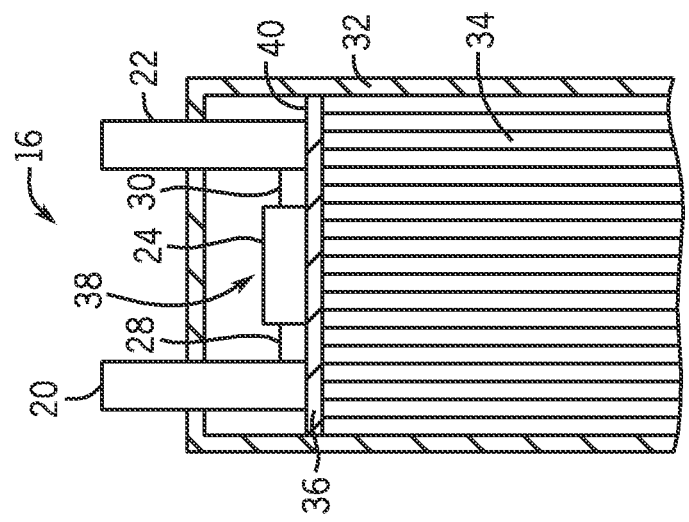
FIG. 3 is a cross-sectional view of an exemplary battery cell including a self-contained measurement device mounted to an interior surface of the battery cell.

FIG. 3 is a cross-sectional view of an exemplary battery cell 16 including a self-contained measurement device 24 mounted to an interior surface of the battery cell 16. In the illustrated embodiment, the battery cell 16 includes an exterior casing 32, a power storage assembly 34, and an insulator 36. As will be appreciated, the power storage assembly 34 includes an anode sheet, a cathode sheet, and a separator disposed between the anode sheet and the cathode sheet. In certain configurations, the sheets are wrapped in a spiral configuration and disposed within an electrolyte. Electrical power may be transferred to and extracted from the power storage assembly 34 via the positive terminal 20 and the negative terminal 22. It should be appreciated that the power storage assembly 34 may utilize any suitable storage configuration, such as lithium-ion, nickel metal-hydride, or lead-acid, among others.

As illustrated, the self-contained measurement device 24 is disposed within a gas-venting region 38 between the insulator 36 and the exterior casing 32. Specifically, measurement device 24 is mounted to an interior surface 40 of the battery cell 16 adjacent to the power storage assembly 34. In certain embodiments, the measurement device 24 is permanently affixed to the interior surface 40. While the measurement device 24 is mounted within the gas-venting region 38 in the present embodiment, it should be appreciated that the measurement device 24 may be mounted to other interior surfaces within the battery cell 16 in alternative embodiments. Mounting the self-contained measurement device 24 within the battery cell 16 may enable the temperature sensor to provide a more accurate measurement than configurations in which the measurement device 24 is mounted on an exterior surface of the battery cell 16. In addition, because the measurement device 24 may be positioned proximate to the anode and cathode sheets, the device 24 may be configured to directly measure the state of charge within the battery cell 16 (e.g., via monitoring an ion concentration). The measurement device 24 may also be configured to measure properties of the electrolyte, such as specific gravity and/or pH, for example.

As will be appreciated, certain battery monitoring systems compare the voltage of the battery cell 16 to an established voltage profile to determine the state of charge. Unfortunately, because the voltage profile varies based on load, an inaccurate state of charge may be reported to a control system or vehicle operator, resulting in inefficient operation of the battery array 14. To provide a more accurate determination of the state of charge, the self-contained measurement device 24 may include a sensor coupled to the anode sheet and to cathode sheet, and configured to directly measure the charge on the sheets. As a result, a more accurate state of charge may be determined, thereby facilitating efficient operation of the battery array 14.

Figure 4:
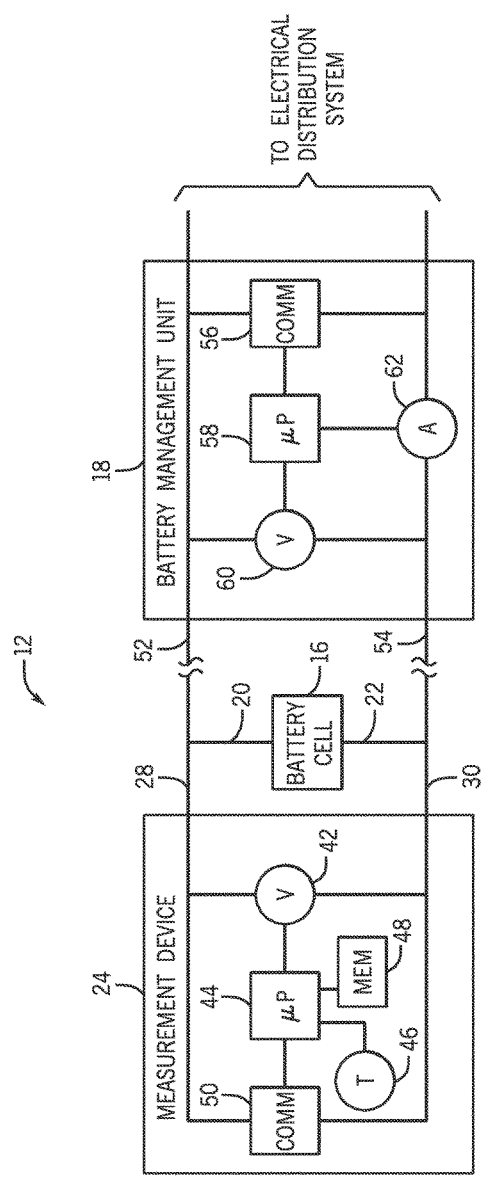
FIG. 4 is a schematic diagram of an embodiment of the battery monitoring system including a self-contained measurement device and a battery management unit.

FIG. 4 is a schematic diagram of an embodiment of the battery monitoring system 12 including the self-contained measurement device 24 and the battery management unit 18. As illustrated, the self-contained measurement device 24 includes a voltmeter 42 electrically coupled to the first lead 28 and to the second lead 30. Because the first lead 28 is electrically connected to the positive battery terminal 20 and the second lead 30 is electrically connected to the negative battery terminal 22, the voltmeter 42 will measure the voltage across the battery cell 16. In the illustrated embodiment, the voltmeter 42 is communicatively coupled to a microprocessor 44. It should be noted that, while reference is made in the present discussion to a microprocessor, any suitable processing circuitry may be employed, such as field programmable gate arrays, and so forth. The microprocessor 44 is configured to receive a signal from the voltmeter 42 indicative of the measured voltage, and to compute the voltage based on the signal. For example, in certain embodiments, the voltmeter 42 may output an analog signal proportional to the measured voltage. In such embodiments, the microprocessor 44 may be configured to convert the analog signal into a digital signal, and to determine the voltage based on the digital signal.

In the illustrated embodiment, the measurement device 24 also includes a temperature sensor 46 communicatively coupled to the microprocessor 44. As previously discussed, the temperature sensor 46 is in direct contact with an interior surface 40 or an exterior surface 26 of the battery cell 16. Accordingly, the temperature sensor 46 will output a signal indicative of the battery cell temperature, and the microprocessor 44 will determine the cell temperature based on the signal. For example, in certain embodiments, the temperature sensor 46 may output an analog signal proportional to the measured temperature. In such embodiments, the microprocessor 44 may be configured to convert the analog signal into a digital signal, and to determine the temperature based on the digital signal.

While the illustrated measurement device 24 includes a voltmeter 42 and a temperature sensor 46, it should be appreciated that alternative embodiments may include additional sensors configured to monitor other operational parameters of the battery cell 16. For example, in certain embodiments, the measurement device 24 may include a sensor configured to measure the state of charge within the battery cell 16. In further embodiments, the measurement device 24 may include a pressure sensor configured to detect an excessive pressure within the gas venting region 38, for example. In yet further embodiments, the measurement device 24 may include an ammeter, a ohmmeter, or other sensor configured to monitor an electrical, physical or chemical parameter of the battery cell 16.

The illustrated measurement device 24 also includes a memory 48 communicatively coupled to the microprocessor 44. The memory 48 may be configured to store battery cell identification information, operational parameter history information and/or usage information. For example, a unique identification number may be associated with each battery cell 16 and stored within the memory 48. In such a configuration, the battery management unit 18 may identify a particular battery cell 16 based on the unique identification number, thereby facilitating communication between measurement device 24 and the battery management unit 18. The memory may also be configured to store historical values of measured operational parameters. For example, the memory 48 may store the maximum voltage measured by the voltmeter 42 and/or the maximum temperature measured by the temperature sensor 46. Such information may be useful for diagnosing faults within the battery cell 16. Furthermore, the memory 48 may be configured to store usage information, such as average load, maximum load, duration of operation, or other parameters that may be useful for monitoring the operational status of the battery cell 16.

In the illustrated embodiment, the measurement device 24 includes a communication module 50 configured to output the operational parameter (e.g., voltage, temperature, etc.) to the battery management unit 18. As illustrated, the communication module 50 is communicatively coupled to the first lead 28 and to the second lead 30. Consequently, the communication module 50 is communicatively coupled to a first power transmission conductor 52 extending between the positive terminal 20 of the battery cell 16 and the battery management unit 18, and to a second power transmission conductor 54 extending between the negative terminal 22 of the battery cell 16 and the battery management unit 18. The first and second power transmission conductors 52 and 54 are configured to transfer a power signal from the battery cell 16 to the battery management unit 18. In the present embodiment, the communication module 50 is configured to output a signal indicative of the operational parameter (e.g., voltage, temperature, etc.) via modulation of the power signal. Specifically, the battery cell 16 is configured to output a direct current (DC) signal to the battery management unit 18. The communication module 50 is configured to modulate the DC signal with an alternating current (AC) signal indicative of the value of the operational parameter. Any suitable data-over-power modulation, superposition or transmission scheme may be employed.

For example, the voltmeter 42 may output an analog signal to the microprocessor 44 indicative of the measured voltage across the battery cell 16. The microprocessor 44 will convert the analog signal from the voltmeter 42 into a digital signal, and determine the voltage based on the digital signal. The microprocessor 44 will then output a digital signal indicative of the measured voltage to the communication module 50. The communication module converts the digital signal into an analog AC signal, and modulates the DC power signal based on the AC voltage signal. A similar process may be utilized to output measured temperature values or other operational parameters.

In certain embodiments, the communication module 50 may be configured to transmit multiple signals indicative of multiple parameters simultaneously or sequentially. For example, the communication module 50 and/or microprocessor 44 may be configured to multiplex a voltage signal and a temperature signal, and to transmit the multiplexed signal to the battery management unit 18. As will be appreciated, additional operational parameters (e.g., pressure, amperage, resistance, etc.) may be included in the multiplexed signal. In alternative embodiments, the voltage signal and the temperature signal may be transmitted sequentially (e.g., voltage signal first and temperature signal second).

As illustrated, the battery management unit 18 includes a communication module 56 electrically coupled to the power transmission conductors 52 and 54. The communication module 56 is configured to receive the AC signal indicative of the measured parameter by monitoring the modulation of the DC power signal. The communication module 56 is also configured to convert the AC signal into a digital signal indicative of the value of the measured parameter, and to output the digital signal to a microprocessor 58. The microprocessor 58 may output the operational parameter to a display, compute the battery cell state of charge and/or alert an operator if the value of the operational parameter deviates from a threshold range. In further embodiments, the microprocessor 58 may output an operational status of the battery array 14 (e.g., average cell temperature, maximum cell temperature, average cell voltage, minimum cell voltage, etc.) to a controller within the propulsion system, thereby enabling the controller to efficiently operate the propulsion system. In the illustrated embodiment, the battery management unit 18 includes a voltmeter 60 and an ammeter 62 communicatively coupled to the microprocessor 58, and configured to monitor the total voltage and amperage of the battery array 14.

Because the signal indicative of the measured operational parameter is transmitted through the power transmission conductors 52 and 54, data cables communicatively coupling each measurement device 24 to the battery management unit 18 may be obviated. The reduction in wiring may substantially reduce the weight and manufacturing costs of the battery monitoring system 12. In addition, the reduced number of connections may enhance the reliability and efficiency of the vehicle propulsion system. As previously discussed, the communication module 50 is electrically coupled to the positive and negative terminals 20 and 22 of the battery cell 16 via the first and second leads 28 and 30. In certain embodiments, the communication module 50 is configured to receive electrical power from the battery cell 16, and to distribute the electrical power to the measurement device 24. In such embodiments, additional power cables configured to provide electrical power to the measurement device 24 may be obviated. As a result, the wiring within the battery monitoring system 12 may be further reduced, thereby reducing weight, decreasing manufacturing costs and/or increasing reliability of the vehicle propulsion system.

The measurement device components described above may be discrete components mounted to a PCB, or elements of an integrated circuit. Furthermore, as previously discussed, the measurement device 24 may be coupled to the exterior surface 26 of the battery cell 16, or the interior surface 40 of the battery cell 16. While a single self-contained measurement device 24 is shown in the illustrated embodiment, it should be appreciated that alternative embodiments may include multiple measurement devices (e.g., one measurement device per battery cell 16) communicatively coupled to the battery management unit 18. In such embodiments, each measurement device 24 may be configured to transmit a unique identification number to the battery management unit 18 along with the AC signal indicative of the operational parameter. Consequently, the battery management unit 18 may associate each received signal with a particular measurement device 24.

Figure 5:
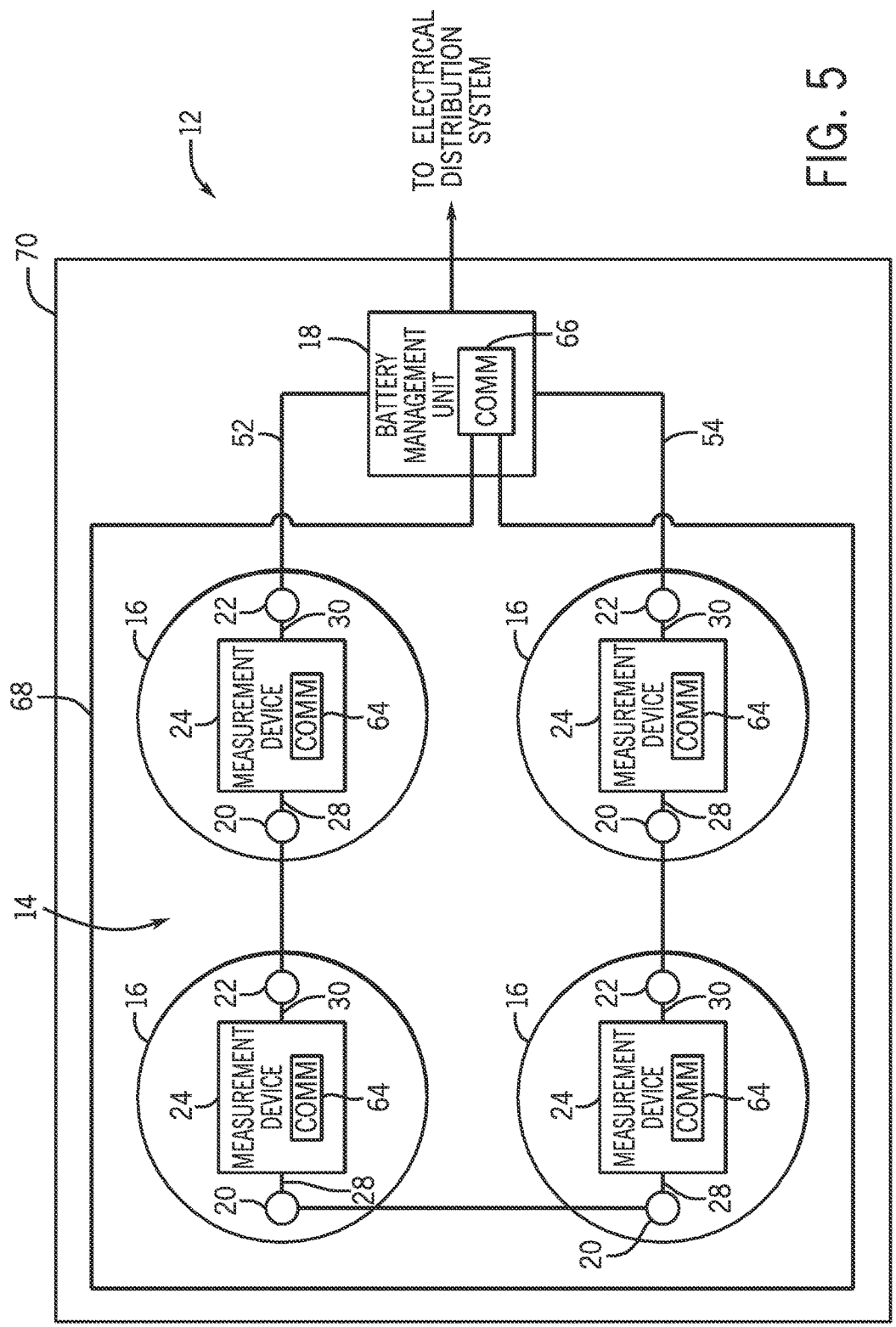
FIG. 5 is a block diagram of another embodiment of the battery monitoring system including a wireless communication link between the self-contained measurement device and the battery management unit.

FIG. 5 is a block diagram of another embodiment of the battery monitoring system 12 including a wireless communication link between the self-contained measurement device 24 and the battery management unit 18. In the illustrated embodiment, each measurement device 24 includes a wireless communication module 64 configured to output the operational parameter via a wireless communication link with the battery management unit 18. Similar to the communication module 50 described above with reference to FIG. 3, the wireless communication module 64 is configured to receive a digital signal indicative of the measured operational parameter from the microprocessor 44. The communication module 64 will then broadcast a wireless signal to a secondary communication module 66 within the battery management unit 18. In the illustrated embodiment, the battery management unit 18 includes an antenna 68 communicatively coupled to the secondary communication module 66. As illustrated, the antenna 68 extends about each battery cell 16 within the array 14, thereby enabling the secondary communication module 66 to receive the signal broadcast by each primary communication module 64. In certain embodiments, the antenna 68 may be printed on the surface of a flex circuit positioned adjacent to the battery array 14. In the illustrated embodiment, the battery monitoring system 12 and the battery array 14 are disposed within an enclosure 70. In certain embodiments, the enclosure may be composed of metal, or may include a metal mesh, thereby shielding external wireless signals from interfering with the wireless communication link.

A variety of transmission methods and communication protocols may be employed within the wireless communication link. For example, in certain embodiments, the primary communication modules 64 may be configured to transmit the signal indicative of the operational parameter within a radio frequency range (e.g., 800 to 900 MHz). However, it should be appreciated that higher or lower frequency ranges (e.g., microwave, infrared, etc.) may be utilized in alternative embodiments. In certain embodiments, the wireless communication link between the primary communication module 64 and the secondary communication module 66 may be bidirectional. For example, each primary communication module 64 may be configured to scan for an activation signal transmitted by the secondary communication module 66. If no activation signal is received, the measurement device 24 will remain in a standby mode. Once the primary communication module 64 receives the activation signal, the measurement device 24 will measure the desired operational parameters, and the primary communication module 64 will transmit a signal to the secondary communication module 66 indicative of each measured parameter. The measurement device 24 will then return to the standby mode. Such a configuration may substantially reduce power consumption compared to configurations that employ a continuous communication link.

Because the signal indicative of the measured operational parameter is transmitted via a wireless communication link, data cables communicatively coupling each measurement device 24 to the battery management unit 18 may be obviated. The reduction in wiring may substantially reduce the weight and manufacturing costs of the battery monitoring system 12. In addition, the reduced number of connections may enhance the reliability and efficiency of the vehicle propulsion system. In the illustrated embodiment, the measurement device 24 is electrically coupled to the positive and negative terminals 20 and 22 of the battery cell 16 via the first and second leads 28 and 30. Consequently, the measurement device 24 will receive electrical power from the battery cell 16, thereby obviating additional power cables configured to provide electrical power to the measurement device 24. As a result, the wiring within the battery monitoring system 12 may be further reduced, thereby reducing weight, decreasing manufacturing costs and/or increasing reliability of the vehicle propulsion system.

It should be appreciated that the communication modules 50 and 64 described above may also function as receivers to facilitate bidirectional communication between the measurement device 24 and the battery management unit 18, and/or between measurement devices 24. For example, in certain embodiments, the communication module 50 described above with reference to FIG. 4 may be configured to scan for an activation signal, and remain in a standby mode until the activation signal is received. In further embodiments, the communication modules 50 and 64 may be configured to facilitate discrete cell interaction, synchronization of data transfer and/or various data polling techniques.

While the arrays 14 described above include multiple battery cells 16, it should be appreciated that certain arrays 14 may include a single battery cell 16. It should also be appreciated that each battery cell 16 within the array 14 may include multiple sub-cells disposed within the cell casing 32. In such embodiments, the self-contained measurement device 24 may be configured to monitor aggregate operational parameters (e.g., voltage, temperature, etc.) of the sub-cells. By way of example, the array 14 may include a single battery cell 16 configured to provide electrical power to a starter motor for a gas-powered engine. The single battery cell 16 may include multiple sub-cells that cooperatively provide sufficient electrical power to the starter motor to initiate operation of the gas-powered engine. In this configuration, a single self-contained measurement device 24 may be mounted to the battery cell 16, and configured to monitor operational parameters of the cell.

While only certain features and embodiments of the invention have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A battery monitoring system, comprising:
a self-contained measurement device configured to mount to a battery cell, wherein the self-contained measurement device comprises:
a first lead configured to couple to a positive terminal of the battery cell and a second lead configured to couple to a negative terminal of the battery cell to enable the self-contained measurement device to operate using first electrical power received from the battery cell via the positive terminal and the negative terminal while the battery cell outputs second electrical power used to operate a battery management unit;
a sensor configured to monitor an operational parameter of the battery cell; and
a communication module configured to output a signal indicative of the operational parameter to the battery management unit via the first lead and the second lead.

2. The battery monitoring system of claim 1, wherein the communication module is configured to output the signal indicative of the operational parameter via modulation of a power signal output by the battery cell.

3. The battery monitoring system of claim 1, wherein the sensor comprises a voltmeter electrically coupled to the first lead and the second lead, and the operational parameter comprises a battery voltage.

4. The battery monitoring system of claim 1, wherein the sensor comprises a temperature sensor, and the operational parameter comprises a battery temperature.

5. The battery monitoring system of claim 1, wherein the self-contained measurement device comprises an integrated circuit having the sensor and the communication module.

6. The battery monitoring system of claim 1, wherein the self-contained measurement device comprises a memory configured to store battery cell identification information, operational parameter history information, usage information, or a combination thereof.

7. The battery monitoring system of claim 1, wherein the communication module is configured to receive a signal from the battery management unit, a second self-contained measurement device, or a combination thereof.

8. The battery monitoring system of claim 1, wherein the self-contained measurement device is configured to mount directly to an interior surface or an exterior surface of the battery cell.

9. The battery monitoring system of claim 1, wherein:
the signal indicative of the operational parameter comprises a modulated alternating current signal; and
the communication module is configured to communicate the operational parameter by combining the modulated alternating current signal with a direct current signal output from the battery cell to supply the second electrical power to the battery management unit.

10. A battery monitoring system, comprising:
a first lead configured to couple to a positive terminal of a battery cell and a second lead configured to couple to a negative terminal of the battery cell to enable the battery monitoring system to operate using first electrical power received from the battery cell via the positive terminal and the negative terminal while the positive terminal and the negative terminal output second electrical power used to operate a battery management unit;
a sensor configured to monitor an operational parameter of the battery cell; and a communication module configured to output a signal indicative of the operational parameter via modulation of a power signal output by the battery cell using the first lead and the second lead.

11. The battery monitoring system of claim 10, comprising a self-contained measurement device configured to mount to the battery cell, wherein the self-contained measurement device includes the first lead, the second lead, the sensor, and the communication module.

12. The battery monitoring system of claim 10, wherein the sensor comprises a voltmeter, a temperature sensor, or a combination thereof.

13. The battery monitoring system of claim 10, comprising a memory configured to store battery cell identification information, operational parameter history information, usage information, or a combination thereof.

14. The battery monitoring system of claim 10, wherein:
the signal indicative of the operational parameter comprises a modulated alternating current signal; and
the communication module is configured to communicate the operational parameter by superposing the modulated alternating current signal on the power signal, wherein the power signal comprises a direct current signal used to supply the second electrical power to the battery management unit.

15. A battery monitoring system, comprising:
a battery array comprising a first battery cell and a second battery cell;
a first self-contained measurement device configured to mount to the first battery cell, wherein the first self-contained measurement device comprises:
  a first sensor configured to monitor a first operational parameter of the first battery cell; and
  a first communication module configured to output a first signal indicative of the first operational parameter via a first wireless communication link;
a second self-contained measurement device configured to mount to the second battery cell, wherein the second self-contained measurement device comprises:
  a second sensor configured to monitor a second operational parameter of the second battery cell; and
  a second communication module configured to output a second signal indicative of the second operational parameter via a second wireless communication link;
a third communication module configured to receive the first signal indicative of the first operational parameter via the first wireless communication link and the second signal indicative of the second operational parameter via the second wireless communication link;
an antenna communicatively coupled to the third communication module and configured to extend about each of the first battery cell and the second battery cell of the battery array to:
  establish the first wireless communication link between the first communication module and the third communication module; and
  establish the second wireless communication link between the second communication module and the third communication module; and
an enclosure configured to house the first sensor, the second sensor, the first communication module, the second communication module, the third communication module, the battery array, and the antenna, wherein the enclosure is configured to shield external signals from interfering with operation of the first wireless communication link and the second wireless communication link.

16. The battery monitoring system of claim 15, wherein:
the first self-contained measurement device is configured to permanently affix to an exterior surface of the first battery cell or an interior surface of the first battery cell; and
the second self-containing measurement device is configured to permanently affix to an exterior surface of the second battery cell or an interior surface of the second battery cell.

17. The battery monitoring system of claim 15, wherein the first sensor comprises a voltmeter, a temperature sensor, or a combination thereof.

18. The battery monitoring system of claim 15, wherein:
the first self-contained measurement device comprises a first integrated circuit having the first sensor and the first communication module; and
the second self-contained measurement device comprises a second integrated circuit having the second sensor and the second communication module.

* * * * *

UNITED STATES PATENT AND TRADEMARK OFFICE
CERTIFICATE OF CORRECTION

PATENT NO. : 9,766,293 B2  
APPLICATION NO. : 13/820720  
DATED : September 19, 2017  
INVENTOR(S) : Michael J. Sims et al.

Page 1 of 1

It is certified that error appears in the above-identified patent and that said Letters Patent is hereby corrected as shown below:

On the Title Page

In Line 3 of Item (75), delete "Mezieres sur Seine" and insert -- Mézières sur Seine --, therefor.

In the Specification

In Column 3, Line 39, delete "electrical" and insert -- electrically --, therefor.

In Column 3, Line 58, delete "battery cell 24," and insert -- battery cell 16, --, therefor.

In Column 6, Line 2, delete "a ohmmeter," and insert -- an ohmmeter, --, therefor.

Signed and Sealed this  
Seventh Day of May, 2019

Andrei Iancu  
*Director of the United States Patent and Trademark Office*